United States Patent [19]

Mody

[11] Patent Number: 5,189,567
[45] Date of Patent: Feb. 23, 1993

[54] HIGH SPEED SWITCHING CIRCUIT FOR CONTROLLING CURRENT FLOW IN A BRIDGE CIRCUIT COIL FOR USE IN A MAGNETO-OPTIC DIRECT OVERWRITE SYSTEM

[75] Inventor: Hemant K. Mody, Rochester, N.Y.

[73] Assignee: Eastman Kodak Company, Rochester, N.Y.

[21] Appl. No.: 749,757

[22] Filed: Aug. 26, 1991

[51] Int. Cl.$^5$ .................. G11B 13/04; G11B 11/12; G11B 11/10
[52] U.S. Cl. .................. 360/59; 369/13; 360/114; 360/66
[58] Field of Search .......... 369/13, 14; 360/59, 360/60, 66, 114; 361/140, 152

[56] References Cited

U.S. PATENT DOCUMENTS

| | | | |
|---|---|---|---|
| 2,112,542 | 3/1938 | Myers | 361/140 |
| 3,665,901 | 5/1972 | Monpetit et al. | 361/140 |
| 4,242,714 | 12/1980 | Yoshida et al. | 361/152 |
| 4,249,225 | 2/1981 | Mapes | 361/152 |
| 4,872,078 | 10/1989 | Gerber et al. | 360/59 |
| 4,937,802 | 6/1990 | Omori et al. | 360/114 |
| 5,091,897 | 2/1992 | Otokawa et al. | 360/59 |

FOREIGN PATENT DOCUMENTS 55-77013 6/1980 Japan .................. 360/66

OTHER PUBLICATIONS

Froess, "Current Reversed in Inductive Loads", IBM Tech. Disclosure Bulletin, vol. 11, No. 10, Mar. 1969, p. 1365.

Primary Examiner—Hoa Nguyen
Attorney, Agent, or Firm—William W. Holloway

[57] ABSTRACT

A resonant AC circuit includes a network of switching elements (e.g., power field-effect transistor) by which the direction of current flow through a coil can be selectively switched at each time in the current cycle, when the current amplitude is substantially zero. Such circuit is particularly advantageous and useful in magneto-optic recording systems for switching the polarity of a magnetic field enabling the direct-overwriting of information on a previously recorded magneto-optic recording element at a high data transfer rate.

15 Claims, 3 Drawing Sheets

HIGH SPEED SWITCHING CIRCUIT FOR CONTROLLING CURRENT FLOW IN A BRIDGE CIRCUIT COIL FOR USE IN A MAGNETO-OPTIC DIRECT OVERWRITE SYSTEM

BACKGROUND OF THE INVENTION

1. Field of the Invention

This invention relates generally to apparatus for reading and writing information patterns on a magneto-optic material and, more particularly, to a circuit for controlling the current, and hence the field, through a coil which provides the field used in conjunction with the read and write operation.

2. Description of the Related Art

The present invention relates to improvements in circuits for rapidly reversing the direction of current flow through an electrical inductor Moreover, it relates to improvements in apparatus for overwriting information previously recorded on a magneto-optic recording element.

In the magneto-optic recording process, digital information is stored in the vertically oriented magnetic domains of a magneto-optic recording element by controlling the "up" or "down" magnetization direction of each domain. The recorded information is recoverable by scan-irradiating the recorded information with a beam of plane-polarized radiation. Depending on the direction of magnetization, the plane of polarization of the reflected beam is slightly rotated, in one direction or the other typically on the order of about one or two degrees, by the well-known Kerr effect. The amount of rotation depends upon the construction and materials of the magneto-optic recording element. The combination of a polarization analyzer and a photodetector positioned in the reflected beam serves to produce an electrical signal which fluctuates in intensity in accordance with the recorded information.

In order to overwrite information previously recorded on a magneto-optic recording element, it is usually necessary to pass the recording element twice past a record/erase head. During the first pass, the previously recorded information is erased by heating the magnetic layer of the magneto-optic recording element to above its Curie temperature and then cooling the magnetic layer in the presence of the magnetic bias field normal to the recording element. This heating and cooling of the magnetic layer has the effect of uniformly aligning all magnetic domains in the direction of the bias field. In the second pass, the bias field direction is reversed, and the individual magnetic domains are selectively heated (again, to above their Curie temperature) in accordance with the digitally encoded information to be recorded. This has the effect of selectively flipping those magnetic domains which are heated, leaving unaltered the orientation of the non-heated domains.

Various schemes have been proposed to reduce the overwrite cycle to one pass in order to double the rate at which information can be overwritten. Such "direct" overwriting schemes usually require multilayered magneto-optic recording elements comprising at least two magnetic recording layers having different Curie temperatures and magnetic coerciveness. (See, for example, the disclosures of U.S. Pat. No. 4,649,519; U.S. Pat. No. 4,910,622; and U.S. Pat. No. 4,893,910). In addition to being relatively complex in construction and, hence, costly to manufacture, such multilayered recording elements require precisely controlled process parameters.

Other direct overwrite schemes have been considered in which the direction of the magnetic bias field is rapidly switched while the data track is continuously scan-irradiated by a focused continuous-wave layer which operates to successively heat each domain to above its Curie temperature. But such schemes have always been considered impractical heretofore due to the relatively slow rate at which the bias field can be switched by conventional switching circuits. (See for example the disclosure of U.S. Pat. No. 4,712,203.) To achieve data recording rates in the megahertz range, it is necessary to switch the polarity of the magnetic bias field in less than a microsecond. While it is possible using a resonant circuit to switch periodically the bias field direction at megahertz frequencies such periodic switching, without data modulation, is not useful for data recording.

SUMMARY OF THE INVENTION

An object of this invention is to provide apparatus by which a previously recorded magneto-optic recording element having only a single magnetic layer can be overwritten in a single pass past a magneto-optic record head. The apparatus of the invention basically comprises a continuous wave laser for heating the magnetic layer of the recording element to above its Curie temperature, means for producing relative movement between the laser and recording element to scan-irradiate the recording element, an electromagnet comprised of a coil for producing a magnetic field generally perpendicular to the plane of the recording element, a resonant AC circuit, operatively coupled to the coil and adapted to switch periodically the direction of current flow through the coil at the resonant frequency, and a switching circuit, operatively connected to the resonant circuit and controllable by a digital data source to be recorded, for controlling the direction of current flow through the coil in accordance with the data to be recorded. According to a preferred embodiment, the switching circuit comprises a bridge network of switching elements by which the direction of current flow through the coil can be selectively switched at each time in the current cycle when the current amplitude through the coil is substantially zero.

The invention and its various advantages will be better understood from the ensuing detailed description of a preferred embodiment, reference being made to the accompanying drawings.

The present invention is directed to overcoming one or more of the problems set forth above. Briefly summarized, according to one aspect of the present invention, a coil provides a magnetic flux density which is suitably oriented to align magnetic domains in a magneto-optic material in a region which is being simultaneously scan-irradiated by a radiation source. The radiation raises the magneto-optic material above the Curie point and permits magnetic field of the coil to align the domains. The coil is part of a resonant circuit and switching apparatus provides for control of the current through the coil at twice the resonant frequency. The information to be stored by the magneto-optic material determines the orientation of the magnetic field of the coil.

These and other aspects, objects, features and advantages of the present invention will be more clearly understood and appreciated from a review of the following detailed description of the preferred embodiments and appended claims, and by reference to the accompanying drawings.

DESCRIPTION OF THE PREFERRED EMBODIMENTS

1. Detailed Description of the Figures

Figure 1:
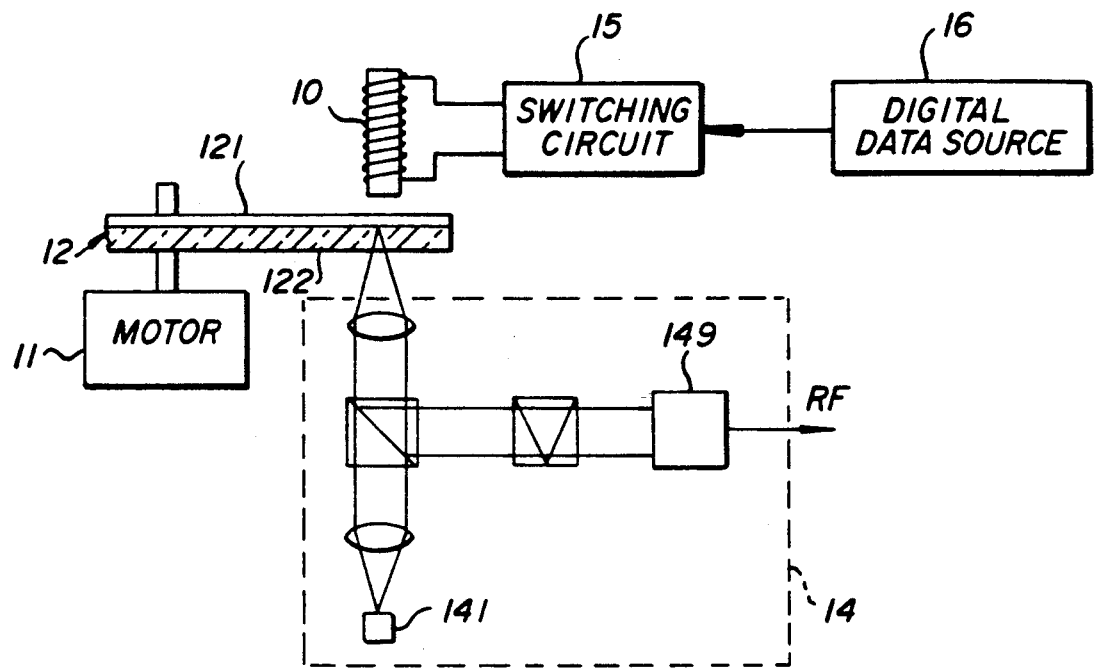
FIG. 1 is a schematic diagram of the magneto-optic recording system of the present invention.

Referring first to FIG. 1, a schematic diagram of the optical recording device is shown. A disc 12 having a transparent layer 122 and a support layer 121 with a surface coating of magneto-optic material is rotated by means of motor 11. An optical system 14 includes a light source 141, which can be implemented using a laser unit, and which focuses radiation on the magneto-optical material between support layer 121 and transparent layer 122. Coil 10 is positioned so as to provide a magnetic field in the vicinity of the magneto-optic material upon which the radiation is focused. The current trough the coil 10 is provided switching circuit 15 operating under the control of digital data source 16.

Figure 2:
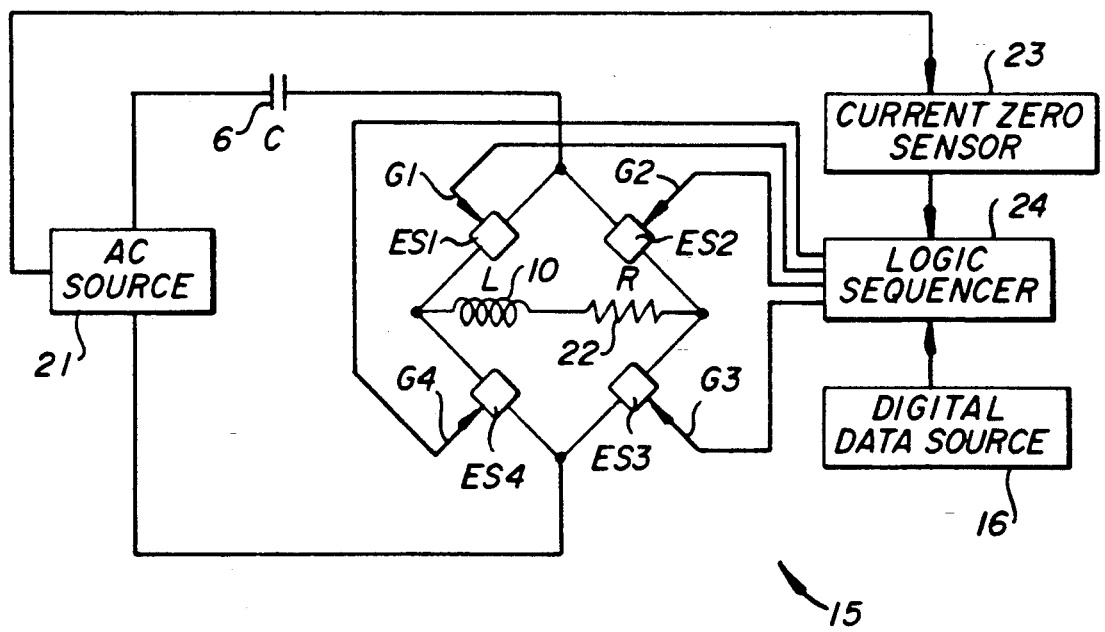
FIG. 2 is an electrical block diagram of the current switching circuit and associated apparatus according to the present invention.

Referring next to FIG. 2, a more detailed diagram of the apparatus used in activating coil 10 according to the present invention is shown. A first terminal of inductive coil 10 is coupled to a first terminal of resistor 22, resistor 22 being the equivalent circuit resistance of the coil 10. A second terminal of coil 10 is coupled to a first terminal of switch ES1 and to a second terminal of switch ES4. A second terminal of switch ES1 is coupled to a first terminal of capacitor 6 and to a first terminal of switch ES2. A second terminal of switch ES2 is coupled to a second terminal of resistor 22 and to a first terminal of switch ES3. A second terminal of switch ES3 is coupled to a second terminal of switch ES4 and to a first terminal of AC source 21. A second terminal of AC source 21 is coupled to a second terminal of capacitor 6. The AC source also applies a signal to current zero sensor 23. Current zero sensor 23 and digital data source 16 apply signals to logic sequencer 24, while logic sequencer 24 applies control (or activation) signals to the switches by means of conducting paths G1 (coupled to ES1), G2 (coupled to ES2), G3 (coupled to ES3), and G4 (coupled to ES4).

Figure 3A:
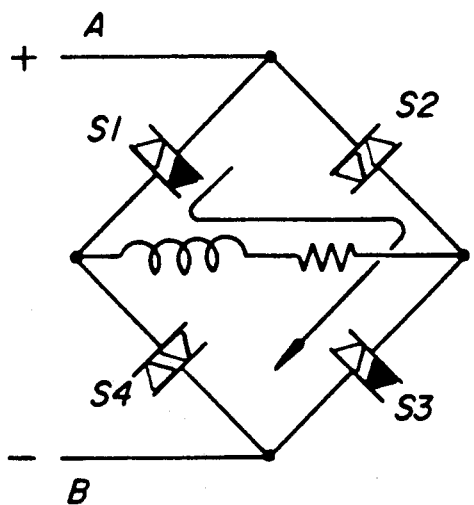
FIG. 3A illustrates the states of the switching elements to provide current flow through the coil in a first direction when the voltage applied to the bridge circuit has a first polarity.
Figure 3B:
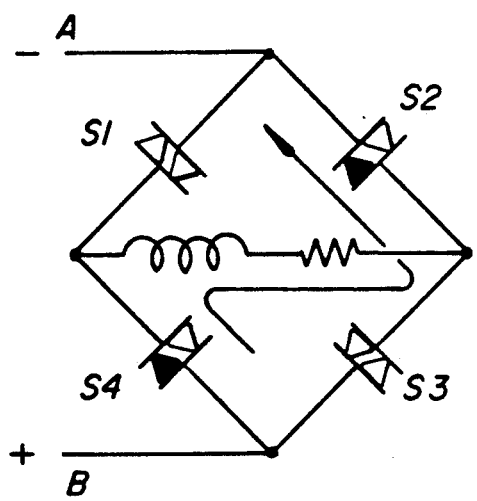
FIG. 3B illustrates the states of the switching elements to provide current through the coil in a first direction when the voltage applied to the bridge circuit has an opposite polarity.
Figure 3C:
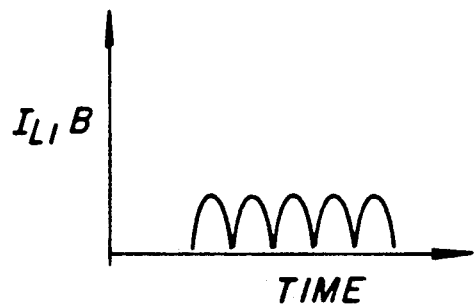
FIG. 3C illustrates the idealized current and magnetic field waveforms associated with coil resulting from the operation of the switching circuit shown in FIG. 3A and FIG. 3B.

Referring next to FIG. 3A and FIG. 3B, the arrangement of the switches of the bridge circuit for producing current in a first direction when alternating current is applied to terminals A and B of the bridge circuit. When a positive polarity voltage is applied to the bridge circuit, switch S1 and switch S3 are placed in the conducting state as shown in FIG. 3A, thereby permitting current to flow in a first direction through the coil. When the polarity of the voltage applied between terminals A and B is negative, switch S4 and switch S2 are activated, thereby causing current to flow through the coil in the first direction. As illustrated in FIG. 3C, the current through the coil is always in the first direction, the state of the switches being determined by the polarity of the applied voltage.

Figure 4A:
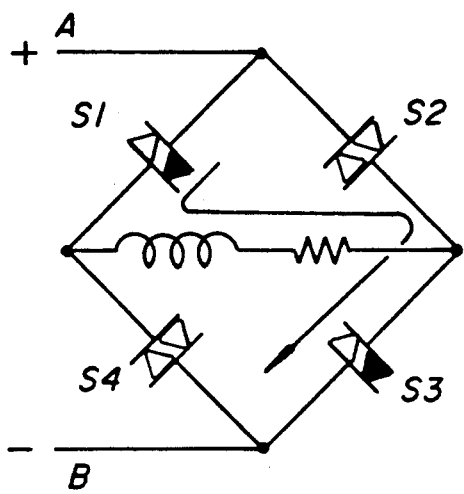
FIG. 4A illustrates the states of the switching elements to provide a current flow through the coil in a first direction when the voltage applied to the bridge circuit has a first polarity.
Figure 4B:
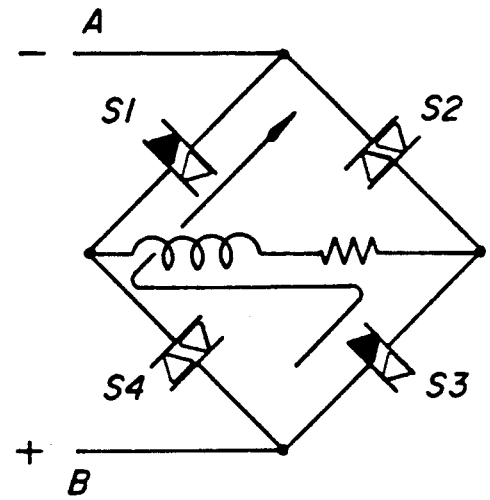
FIG. 4B illustrates the states of the switching elements to provide a current through the coil in an opposite direction when the voltage applied to the bridge circuit has the opposite polarity.
Figure 4C:
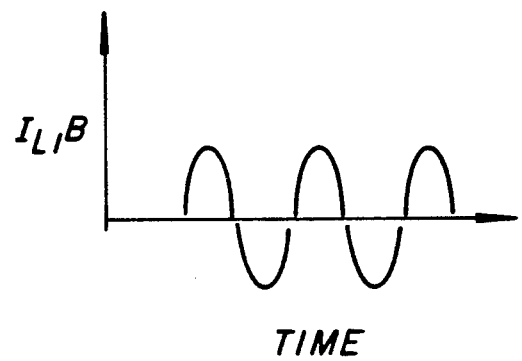
FIG. 4C illustrates the idealized current and magnetic field waveforms associated with the coil resulting from the operation of the circuit shown in FIG. 4A and FIG. 4B.
Figure 5C:
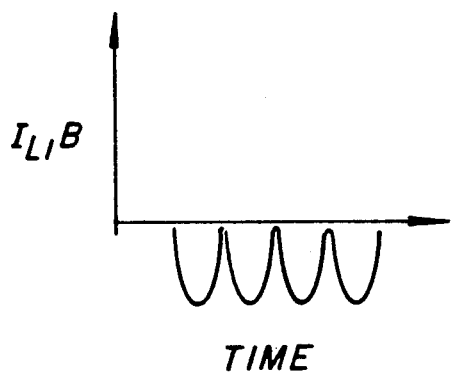
FIG. 5C illustrates the idealized current and magnetic flux density waveforms associated with the coil resulting from operation the switching circuit illustrated in FIG. 5A and FIG. 5B.

Referring next to FIG. 4A and FIG. 4B, the state of the switches to provide an alternating current through the coil when alternating voltage is applied to the terminals of the bridge circuit. When the voltage applied between terminal A and terminal B has a first polarity, switch S1 and switch S3 are activated, permitting the current to flow in the first direction through the coil. When the voltage applied between terminal A and terminal B has the opposite polarity, switch S1 and switch S3 are once again activated, the current thereby flowing in an opposite direction through the coil (as well as flowing in the opposite direction through switches S1 and S4). The current flow through the coil and the magnetic field produced by the current through the coil is shown in FIG. 4C.

Figure 5A:
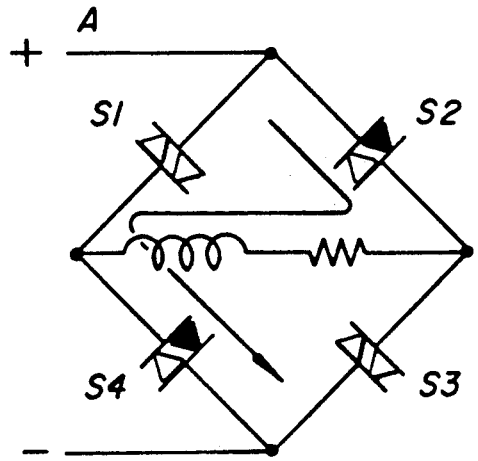
FIG. 5A illustrates the states of the switching elements to provide current flow through the coil in the opposite direction when the voltage applied to the bridge circuit has a first polarity.
Figure 5B:
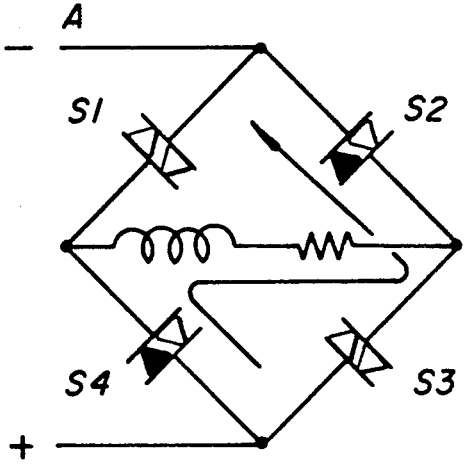
FIG. 5B illustrates the states of the switching elements to provide a current through the coil in an opposite direction when the voltage applied to the bridge circuit has an opposite polarity.

Referring to FIG. 5A and FIG. 5B. the state of the switches to provide a current flowing in an opposite direction through the coil when the bridge circuit is energized with alternating voltage is illustrated. When the voltage applied between terminal A and terminal B has a first polarity, then switch S2 and switch S4 are activated and current flows through the coil in an opposite direction, i.e., from the flow of current illustrated in FIG. 3A through FIG. 3C. When voltage of opposite polarity is applied between terminal A and terminal B, switch S2 and switch S4 are activated and the current continues to flow in the opposite direction through the coil.

Figure 6:
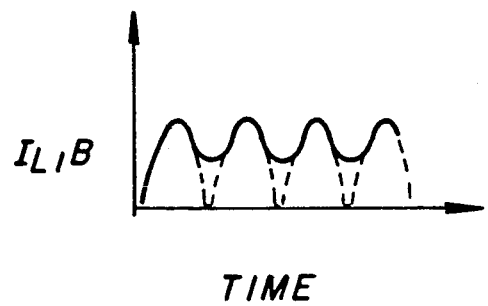
FIG. 6 illustrates the current $I_L$ flowing through the coil and the magnetic flux density B achieved in the vicinity of the focused optical radiation for circuit configurations of FIG. 3A and FIG. 3B with the addition of hysteresis.

Referring to FIG. 6, the actual waveform of the current (and the resulting magnetic field) is shown for the switch configuration described in FIG. 3A and FIG. 3B when hysteresis is present in the circuit. The hysteresis can be provided, for example by the addition of a ferromagnetic material in the vicinity of the coil. One of the advantages of the smoothed waveform is the average magnetic field experienced by the magneto optic layer is larger than the average field for the ideal current waveform.

2. Operation of the Preferred Embodiment

In order to write information on the magneto-optic layer, the optical radiation, typically a focused laser beam, is directed to a predetermined location on the rotating optical disc. The focused radiation raises a region of the magneto-optic material above the Curie temperature. Once above the Curie temperature, the ordering of the magneto-optic material can be determined by an externally applied field. Specifically, two states of the magneto-optic material can typically be obtained. Two vertically oriented magnetic states, the orientation of the magnetic states being in opposite directions, can be achieved depending on the externally applied field. When a high frequency alternating magnetic field is applied to the magneto-optic material and the material allowed to cool below the Curie temperature, the magneto-optic material will typically not have a magnetic orientation. With respect to the two states of magnetic ordering of the material perpendicular to the plane of the magneto-optic material, these orderings can be produced by applying a suitably oriented magnetic field having a sizable magnetic component to the region of the magneto-optic material which is being cooled below the Curie temperature. In this manner, the magnetic ordering is frozen into the magneto-optic material. It is this magnetic ordering that interacts with the "read" radiation and permits the identification of information stored on the optical disc.

The externally applied magnetic field is generated by the coil in response to the associated electrical components shown in FIG. 2 which control the current through the coil and, consequently, the magnetic field applied to the magneto-optic materials. The AC source 21, the coil 10 and the capacitor 6 are selected so that the series combination of the coil (inductor) 10 and the capacitance 6 has a resonance frequency substantially the same frequency as the frequency of the AC source. The digital data source 16 determines the magnetic state to be created in the magneto-optic material. The logic sequencer 24 controls the state of the switches S1-S4 in response to the magnetic state to be created in the magneto-optic material at the location presently determined by the position of the laser beam. As indicated in FIGS. 3A-3C, FIGS. 4A-4C, and FIGS. 5A-5C. The switch states must be changed each time the current through the coil inductor passes through a zero value. In the preferred embodiment, the zero current crossover condition is detected in AC source 21 by the current zero sensor. The current zero sensor indicates when the state of the switches should be changed, i.e., to change from the state illustrated in FIG. 3A to the state illustrated in FIG. 3B, etc. Thus, the combination of the digital data source 16 and the current zero sensor 23 identify to the logic sequencer the state in which the switches should be found to create the desired state of magnetic orientation.

The digital data source is meant to be indicative of apparatus for providing an external interface for the control of the applied magnetic field. The external interface can respond to stored information signals or to externally applied information signals and ultimately determines the information to be stored on the optical disc.

It will be clear that the switches used in the bridge circuit can be triacs, relays, transistors or any other type of component suitable for switching applications. (The components, however, must be capable of operation in the microsecond range to provide practical rates of data transfer for the magneto-optic data storage medium application). Typically, a delay will exist between the detection of a zero current and the activation of the switching device. Therefore, the current zero sensor 23 typically is activated when the current approaches within a predetermined value of zero current in order to compensate to circuit and other signal delays.

While the invention has been described with reference to magneto-optic materials having magnetic domains which can be aligned with a vertical direction relative to the material surface, it is apparent that the invention is appreciable to magneto-optic materials having observable effects with orientations in different directions. In addition, the invention has been described with respect to the recording of information. It will be clear that the control of the direction of a current through an inductor can have utility independent of the application to the storage of information in an optical storage system. While the invention has been described with particular reference to a preferred embodiment, it will be understood by those skilled in the art that various changes may be made and equivalents may be substituted for elements of the preferred embodiment without departing from invention. In addition, many modifications may be made to adapt a particular situation and material to a teaching of the invention without departing from the essential teachings of the present invention.

As is evident from the foregoing description, certain aspects of the invention are not limited to the particular details of the examples illustrated, and it is therefore contemplated that other modifications and applications will occur to those skilled in the art. It is accordingly intended that the claims shall cover all such modifications and applications as do not depart from the true spirit and scope of the invention.

What is claimed is:

1. A direct over-write magneto-optic recording apparatus for recording digital information in a magnetic recording layer of the type having vertically oriented magnetic domains, said digital information identified by a digital information source, said apparatus comprising:

(a) means for scan-irradiating the recording layer with a beam of radiant energy to elevate the temperature of a selected portion of the magnetic recording layer to a level above the Curie temperature of said layer;

(b) an energizing source for providing an alternating current having a predetermined frequency;

(c) magnetic field-producing means for producing a magnetic field in the irradiated portion of the recording layer, said field being parallel to the vertical orientation of said magnetic domains, said field-producing means including a coil; and (d) circuit means operatively coupled between said coil and said energizing source, said circuit means including a capacitive element coupled in series with said energizing source, said capacitive element and an inductance of said coil included in a resonant circuit having a resonant frequency generally equal to said predetermined frequency, said circuit means adapted to control a direction of said alternating current through said coil for each positive current and negative current half cycle of said alternating current predetermined frequency, said circuit means controlling said direction in response to signals from said digital information source.

2. The apparatus as defined by claim 1, wherein said circuit means includes a bridge circuit having four switching elements, said circuit means determining a state of said switching elements in response to a current amplitude in said coil which is substantially zero.

3. The apparatus as defined by claim 2, wherein said switching elements are comprises of triacs.

4. A direct over-write magneto-optic recording apparatus for recording digital information in a magnetic recording layer of the type having vertically oriented magnetic domains, wherein an information data source provides control signals identifying data to be stored by said recording apparatus, said apparatus comprising:
(a) means for scan-irradiating the recording layer with a beam of radiant energy to elevate the temperature of a selected portion of the magnetic recording layer to a level above the Curie temperature of said layer;
(b) magnetic field-producing means for producing a magnetic field in the irradiated portion of the recording element, said field being parallel to the vertical orientation of said magnetic domains, said field-producing means including a coil and a current source, said current source providing a high frequency alternating current, wherein a field current through said coil produces said magnetic field; and
(c) switching means coupled to said coil for controlling a direction of said field current through said coil; and
(d) a capacitive element coupled between said current source and said switching means, said coil and said capacitive element being coupled in series to provide a resonant circuit having a resonant frequency substantially equal to a frequency of said current source, said switching means switching conducting states to control a direction of field current for each positive and each negative half cycle of said alternating current, a state of said switching means being determined by said control signals.

5. The recording apparatus of claim 4 wherein said switching means includes a bridge circuit, said bridge circuit having a switching element in each arm of said bridge circuit, wherein states of said switching elements determine a direction of said field current through said coil.

6. The recording apparatus of claim 4 wherein said switching means has a first mode of operation wherein said field current flows through said coil in a first direction, a second mode of operation wherein said current flows through said coil in an opposite direction, and a third mode of operation wherein said current to alternates directions during each cycle of said predetermined frequency.

7. A direct over-write magneto-optic recording apparatus for recording digital information in a magnetic recording layer of the type having magnetic domains with a plurality of vertical orientations, wherein said digital information to be recorded is represented by control signals determining a representation of said digital information by said recording layer, said apparatus comprising:
(a) means for scan-irradiating said the recording layer with a beam of radiant energy to elevate a temperature of a selected portion of the magnetic recording layer to a level above the Curie temperature of said layer;
(b) magnetic field-producing means for producing a magnetic field in an irradiated portion of the recording element, said field being substantially parallel to said vertical orientations of said magnetic domains, said field-producing means including a coil and a high frequency current source, said current source providing an alternating current for energizing said coil;
(c) circuit means responsive to current through said coil for producing a no-current signal when a current through said coil is substantially zero;
(d) a capacitive element coupled to said current source; and
(e) switch means coupled between said capacitive element and said coil for controlling a direction of current through said coil, a state of said switch means determined by said no-current signal and said control signals for each positive and negative half cycle of said alternating current.

8. The recording apparatus of claim 7 wherein said switch means includes a bridge circuit having four switching elements.

9. The recording apparatus of claim 7 wherein current through said coil flows in a first direction in a first mode of operation, flows in an opposite direction in a second mode of operation, and flows in alternating directions in a third mode of operation; a flow of said current being controlled by said control signals.

10. The recording apparatus of claim 7 wherein a hysteresis-producing material is associated with said magnetic field-producing coil.

11. Apparatus for controlling a direction of current flowing through an inductive element, said current being provided to said inductive element by an alternating current source having a selected frequency, said apparatus comprising:
signal means responsive to a flow of current through said inductive element for providing activation signals when said flow of current through said inductive element has a predetermined value;
a capacitor having a first terminal coupled to a first terminal of said alternating current source, a series resonant frequency of capacitor and said inductive element being substantially equal to said selected frequency of said alternating current source; and
a plurality of switching elements responsive to said activation signals, a first and a second of said switching elements being coupled between a first and a second terminal respectively of said inductive element and a second terminal of said capacitor, a third and a fourth of said switching elements coupled between said first and said second terminals respectively of said inductive element and a second terminal of said alternating current source, wherein said activation signals control conducting states of said switching elements for each half positive and each negative half cycle of current from said alternating current source.

12. The apparatus of claim 11 wherein a first group of activation signals causes current through said coil to flow in a first direction, a second group of activation signals causes current through sad coil to flow in an opposite direction, and a third group of activation signals causes current through said coil to alternate directions of flow with said selected frequency.

13. The apparatus of claim 11 wherein said activation signals control conducing states of said switching elements to determine a direction of current flow through each of said switching elements.

14. The apparatus of claim 13 further comprising:
control logic means responsive to stored and to externally applied data signals for applying control signals to said signal means, said control signals and predetermined current value providing said activation signals.

15. The apparatus of claim 11 wherein said plurality of switching elements are coupled in a bridge circuit.

* * * * *